US011999877B2

(12) United States Patent
Granstrom (10) Patent No.: US 11,999,877 B2
(45) Date of Patent: Jun. 4, 2024

(54) SILICON NITRIDE CHEMICAL MECHANICAL POLISHING SLURRY WITH SILICON NITRIDE REMOVAL RATE ENHANCERS AND METHODS OF USE THEREOF (71) Applicant: FUJIMI INCORPORATED, Aichi (JP)

(72) Inventor: Jimmy Granstrom, Beaverton, OR (US)

(73) Assignee: FUJIMI INCORPORATED, Aichi (JP)

(*) Notice: Subject to any disclaimer, the term of this patent is extended or adjusted under 35 U.S.C. 154(b) by 152 days.

(21) Appl. No.: 17/689,236

(22) Filed: Mar. 8, 2022

(65) Prior Publication Data

US 2022/0315800 A1    Oct. 6, 2022

Related U.S. Application Data (60) Provisional application No. 63/165,358, filed on Mar. 24, 2021.

(51) Int. Cl.
   *C09G 1/02*    (2006.01)
   *H01L 21/3105*    (2006.01)
(52) U.S. Cl.
   CPC .......... *C09G 1/02* (2013.01); *H01L 21/31053* (2013.01)
(58) Field of Classification Search
   None
   See application file for complete search history.

(56) References Cited

U.S. PATENT DOCUMENTS

| 9,284,472 B2 | 3/2016 | Saeki et al. |
| 9,944,827 B2 | 4/2018 | Mishima et al. |
| 10,752,807 B2 | 8/2020 | Minami et al. |
| 2001/0008828 A1 | 7/2001 | Uchikura et al. |
| 2009/0215269 A1 | 8/2009 | Boggs et al. |
| 2011/0318929 A1 | 12/2011 | Mishima et al. |
| 2012/0058642 A1 | 3/2012 | White et al. |

FOREIGN PATENT DOCUMENTS

| EP | 1386949 A2 * | 2/2004 | .............. C09G 1/02 |
| JP | 2007-311779 A | 11/2007 | |
| JP | 20103732 A | 1/2010 | |
| JP | 2010188514 A | 9/2010 | |
| JP | 2012-33887 A | 2/2012 | |

(Continued)

OTHER PUBLICATIONS

Cano-Serrano et al., "Sulfonic acid-functionalized silica through quantitative oxidation of thiol groups," Chem. Commun., 2003, 2:246-247.

(Continued)

*Primary Examiner* — Roberts P Culbert
(74) *Attorney, Agent, or Firm* — Katten Muchin Rosenman LLP (57) ABSTRACT

The present disclosure relates to relates to silicon nitride (SiN) chemical-mechanical polishing (CMP) compositions with SiN removal rate enhancers. The SiN CMP compositions increase the SiN polishing rate while suppressing the tetratethylorthosilicate (TEOS) polishing rate, thus providing a high SiN/TEOS selectivity ratio and reducing any defects on the surfaces of polished substrates.

15 Claims, 3 Drawing Sheets

(56) References Cited

FOREIGN PATENT DOCUMENTS

| JP | 2019-149548 A | 9/2019 | | |
|---|---|---|---|---|
| WO | 2011077973 A1 | 6/2011 | | |
| WO | WO-2018061582 A1 * | 4/2018 | ............... | B08B 3/08 |
| WO | 2018/099110 A1 | 6/2018 | | |

OTHER PUBLICATIONS

Kazuo et al., "Novel Silane Coupling Agents Containing a Photolabile 2-Nitrobenzyl Ester for Introduction of a Carboxy Group on the Surface of Silica Gel," Chemistry Letters, 2000, 29(3):228-229.

* cited by examiner

SILICON NITRIDE CHEMICAL MECHANICAL POLISHING SLURRY WITH SILICON NITRIDE REMOVAL RATE ENHANCERS AND METHODS OF USE THEREOF

TECHNICAL FIELD

The present disclosure relates to silicon nitride (SiN) chemical mechanical polishing (CMP) compositions with SiN removal rate enhancers. More particularly, the SiN CMP compositions comprise an abrasive, a SiN removal rate enhancer, a pH adjusting agent, and water, combined in specified amounts to provide a specific electrical conductivity and high SiN:TEOS removal rate selectivity.

BACKGROUND

Chemical mechanical polishing (CMP) is a process in which material is removed from a surface of a substrate (such as a semiconductor wafer), and the surface is polished (planarized) by coupling a physical process, such as abrasion, with a chemical process, such as oxidation or chelation. In its most rudimentary form, CMP involves applying a slurry to the surface of the substrate or a polishing pad that polishes the substrate. This process achieves both the removal of unwanted material and planarization of the surface of the substrate. It is not desirable for the removal or polishing process to be purely physical or purely chemical, but rather comprise a synergistic combination of both.

CMP is used on a large variety of objects, examples of which include silicon dioxide ($SiO_2$) in inter-layer or buried dielectrics, metals such as aluminum (Al), copper (Cu), and tungsten (W) in wiring layers or plugs connecting to such a wiring layer, a barrier metal layer such as tantalum (Ta), tantalum nitride (TaN), and titanium (Ti), polysilicon for use as a trench capacitor, and silicon nitride, which is used in a wide range of applications. Examples for the use of silicon nitride include dielectric materials, passivation layers, etching masks, and the like.

The CMP process is typically carried out in a two-step sequence. The first step is specifically designed to rapidly remove interconnected metal, such as copper, from the surface of a substrate. The second step removes the barrier layer, such as SiN, while attempting to not adversely affect the physical structure or electrical properties of the interconnected metal structure.

During removal of the barrier (such as a SiN) layer, the underlying layer may also be removed. This underlying layer is often a silicon oxide-containing material, such as tetratethylorthosilicate (TEOS). Unfortunately, polishing compositions that remove silicon oxide-containing materials at rapid removal rates tend to also remove underlying masks, caps, anti-reflective coatings, and dielectrics at unacceptable removal rates. The uncontrolled removal of these underlying masks, caps, anti-reflective coatings, and dielectrics has a detrimental impact upon the ultimate performance of semiconductors.

Accordingly, the polishing of semiconductors requires selective removal of silicon nitride in comparison to silicon oxide-containing material. However, the silicon nitride layer has a very high mechanical strength, which necessitates a low polishing speed or the use of heat when removing the silicon nitride layer. These processes prolong the polishing process and lower the throughput of the process when using CMP. Accordingly, polishing compositions currently used in CMP have issues such as high oxide polishing speeds, low SiN:TEOS removal rate ratios, and scratches on the surface of polished substrates.

In light of the challenges surrounding selective polishing of SiN containing substrates, it is critical to identify polishing compositions enabling a high SiN removal rate while simultaneously enabling a low TEOS removal rate, thereby resulting in a high SiN:TEOS removal rate selectivity. These and other challenges are addressed by the subject matter disclosed herein.

SUMMARY

In accordance with the purpose(s) of the currently disclosed subject matter or problems to be solved by the invention, as embodied and broadly described herein, it is an object of the present invention to provide a composition for polishing substrates, such as SiN, that facilitate improvement in polishing speeds when using CMP. Another object of the present invention is to provide a method for selective removal of a material from a substrate, such as SiN.

Accordingly, the presently disclosed subject matter in one aspect relates to a polishing composition comprising an abrasive, a SiN removal rate enhancer, a pH adjusting agent, and water. In an embodiment, the abrasive is anion-modified silica wherein a surface of the anion-modified silica has sulfonic acid groups covalently attached; the SiN removal rate enhancer is a substituted 5- or 6-membered heterocycle, wherein the heterocyclic ring comprises at least two nitrogen atoms and the heterocycle is substituted with at least one group selected from $-NH_2$ and $-SH$; and the polishing composition has a pH from about 4 to about 6.

In a further embodiment, the polishing composition has an electrical conductivity from greater than zero to about 0.25 mS/cm, and a SiN:TEOS removal rate ratio of at least 40.

In another aspect, the subject matter described herein is directed to a method for polishing a substrate, the method comprising the steps of: 1) providing the polishing composition described herein; 2) providing a substrate, wherein the substrate comprises a SiN layer; and 3) polishing the substrate with the polishing composition to provide a polished substrate.

These and other aspects are disclosed in further detail below.

DETAILED DESCRIPTION

The present invention can be understood more readily by reference to the following detailed description of the invention and the Examples included therein.

Before the present compounds, compositions, articles, systems, devices, and/or methods are disclosed and described, it is to be understood that they are not limited to specific synthetic methods unless otherwise specified, or to particular components unless otherwise specified, as such may, of course, vary. It is also to be understood that the terminology used herein is for the purpose of describing particular aspects only, and is not intended to be limiting. Although any methods and materials similar or equivalent to those described herein can be used in the practice or testing of the present invention, example methods and materials are now described.

As described herein, are polishing compositions comprising a SiN removal rate enhancer, a pH adjusting agent, an abrasive, and water. These polishing compositions are intended for polishing a substrate where the polishing compositions exhibit at least one benefit such as: 1) increased SiN removal rate; 2) decreased TEOS removal rate; and 3) reduced etching of the surfaces of the substrate.

The electrical conductivity (EC), polishing rates, and SiN:TEOS polishing rate ratios of the polishing compositions described herein are key properties. Too high of an electrical conductivity and the SiN:TEOS polishing rate ratios will be reduced. For example, in an embodiment, a polishing composition comprising a SiN removal rate enhancer, a pH adjusting agent, an abrasive, and water has been found to provide a high SiN:TEOS removal rate ratio, wherein the concentrations of each component the polishing composition must be present in specific amounts to provide a high rate of SiN removal and a low rate of TEOS removal. For example, if the polishing composition comprises too much pH adjusting agent, detrimental effects may be observed (such as corrosion of metal layers within the substrate to be polished).

The polishing compositions described herein have uses such as, but not limited to, the CMP of SiN-containing semiconductor wafers.

A. DEFINITIONS

Listed below are definitions of various terms used to describe this invention. These definitions apply to the terms as they are used throughout this specification, unless otherwise limited in specific instances, either individually or as part of a larger group.

As used in the specification and the appended claims, the singular forms "a", "an" and "the" include plural referents unless the context clearly dictates otherwise. Thus, for example, reference to "an abrasive" or "a pH adjusting agent" includes mixtures of two or more such abrasives or pH adjusting agents.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is herein disclosed as "about" that particular value in addition to the value itself. For example, if the value "10" is disclosed, then "about 10" is also disclosed. It is also understood that each unit between two particular units is also disclosed. For example, if 10 and 15 are disclosed, then 11, 12, 13, and 14 are also disclosed.

References in the specification and concluding claims to parts by weight of a particular element or component in a composition denote the weight relationship between the element or component and any other elements or components in the composition or article for which a part by weight is expressed. Thus, in a compound containing 2 parts by weight of component X and 5 parts by weight of component Y, X and Y are present at a weight ratio of 2:5, and are present in such ratio regardless of whether additional components are contained in the compositions.

A weight percent (wt %) of a component, unless specifically stated to the contrary, is based on the total weight of the vehicle or composition in which the component is included.

As used herein, the terms "optional" and "optionally" mean that the subsequently described event or circumstance can or cannot occur, and that the description includes instances where said event or circumstance occurs and instances where it does not.

The term "heteroaryl" or "heteroaromatic" refers to a monovalent aromatic radical of 5- or 6-membered rings, and includes fused ring systems (at least one of which is aromatic) of 5-20 atoms, containing one or more heteroatoms independently selected from nitrogen, oxygen, and sulfur. Examples of heteroaryl groups are pyridinyl (including, for example, 2-hydroxypyridinyl), imidazolyl, imidazopyridinyl, pyrimidinyl (including, for example, 4-hydroxypyrimidinyl), pyrazolyl, triazolyl (including, for example, 3-amino-1,2-4-triazole or 3-mercapto-1,2,4-triazole), pyrazinyl (including, for example, aminopyrazine), tetrazolyl, furyl, thienyl, isoxazolyl, thiazolyl, oxadiazolyl, oxazolyl, isothiazolyl, pyrrolyl, quinolinyl, isoquinolinyl, tetrahydroisoquinolinyl, indolyl, benzimidazolyl, benzofuranyl, cinnolinyl, indazolyl, indolizinyl, phthalazinyl, pyridazinyl, triazinyl, isoindolyl, pteridinyl, purinyl, oxadiazolyl, triazolyl, thiadiazolyl, furazanyl, benzofurazanyl, benzothiophenyl, benzothiazolyl, benzoxazolyl, quinazolinyl, quinoxalinyl, naphthyridinyl, and furopyridinyl. The heteroaryl groups are thus, in some embodiments, monocyclic or bicyclic. Heteroaryl groups are optionally substituted independently with one or more substituents described herein.

As used herein, the term "substituted" refers to a moiety (such as heteroaryl), wherein the moiety is bonded to one or more additional organic radicals. In some embodiments, the substituted moiety comprises 1, 2, 3, 4, or 5 additional substituent groups or radicals. Suitable organic substituent radicals include, but are not limited to, hydroxyl, amino, mono-substituted amino, di-substituted amino, mercapto, alkylthiol, alkoxy, substituted alkoxy or haloalkoxy radicals, wherein the terms are defined herein. Unless otherwise indicated herein, the organic substituents can comprise from 1 to 4 or from 5 to 8 carbon atoms. When a substituted moiety is bonded thereon with more than one substituent radical, then the substituent radicals may be the same or different.

As used herein, the term "alkyl" refers to a straight or branched chain hydrocarbon containing from 1 to 10 carbon atoms. Representative examples of alkyl include, but are not limited to, methyl, ethyl, n-propyl, isopropyl, n-butyl, sec-butyl, isobutyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, n-decyl, and the like. These groups may be substituted with groups selected from halo (e.g., haloalkyl), alkyl, haloalkyl, alkenyl, alkynyl, cycloalkyl, cycloalkylalkyl, aryl, arylalkyl, heterocyclo, heterocycloalkyl, hydroxyl, alkoxy (thereby creating a polyalkoxy such as polyethylene glycol), alkenyloxy, alkynyloxy, haloalkoxy, cycloalkoxy, cycloalkylalkyloxy, aryloxy, arylalkyloxy, heterocyclooxy, heterocyclolalkyloxy, mercapto; carboxy, alkylamino, alkenylamino, alkynylamino, haloalkylamino, cycloalkylamino, cycloalkylalkylamino, arylamino, arylalkylamino, heterocycloamino, heterocycloalkylamino, disubstituted-amino, ester, amide, nitro, or cyano.

As used herein, the term "alkoxy", used alone or as part of another group, means the radical —OR, where R is an alkyl group as defined herein.

As used herein, the term "halo" refers to any suitable halogen, including —F, —Cl, —Br, and —I.

As used herein, the term "mercapto" refers to an —SH group.

As used herein, the term "cyano" refers to a —CN group.

As used herein, the term "carboxylic acid" refers to a —C(O)OH group.

As used herein, the term "hydroxyl" refers to an —OH group.

As used herein, the term "nitro" refers to an —$NO_2$ group.

As used herein, the term "acyl", used alone or as part of another group, refers to a —C(O)R radical, where R is any suitable substituent such as aryl, alkyl, alkenyl, alkynyl, cycloalkyl or other suitable substituent as described herein.

As used herein, the term "alkylthio", used alone or as part of another group, refers to an alkyl group, as defined herein, appended to the parent molecular moiety through a thio moiety, as defined herein. Representative examples of alkylthio include, but are not limited, methylthio, ethylthio, tert-butylthio, hexylthio, and the like.

As used herein, the term "amino" means the radical —$NH_2$.

As used herein, the term "alkylamino" or "mono-substituted amino", used alone or as part of another group, means the radical —NHR, where R is an alkyl group.

As used herein, the term "disubstituted amino", used alone or as part of another group, means the radical —$NR_aR_b$, where $R_a$ and $R_b$ are independently selected from the groups alkyl, haloalkyl, alkenyl, alkynyl, cycloalkyl, cycloalkylalkyl, aryl, arylalkyl, heterocyclo, and heterocycloalkyl.

As used herein, the term "ester", used alone or as part of another group, refers to a —C(O)OR radical, where R is any suitable substituent such as alkyl, cycloalkyl, alkenyl, alkynyl or aryl.

As used herein, the term "amide", used alone or as part of another group, refers to a —$C(O)NR_aR_b$ radical, where $R_a$ and $R_b$ are any suitable substituent such as alkyl, cycloalkyl, alkenyl, alkynyl or aryl.

As used herein, the term "sulfonic acid" refers to a compound of the formula —S(O)(O)OH.

As used herein, the term "unsubstituted" refers to a moiety (such as heteroaryl) that is not bonded to one or more additional organic or inorganic substituent radical as described above, meaning that such a moiety is only substituted with hydrogens.

As used herein, the term "monocyclic" refers to a molecular structure that contains a single ring of atoms such as, for example, benzene or cyclopropane.

As used herein, the term "bicyclic" refers to a molecular structure that contains two rings of atoms that are fused together such as, for example, naphthalene.

B. POLISHING COMPOSITION

The fundamental mechanism of CMP is to soften a surface layer by chemical reaction and then remove the softened layer by mechanical force with abrasive particles. However, the role of CMP is not only material removal, but also planarization, surface smoothening, uniformity control, defect reduction and more. Semiconductor yield enhancement is thus influenced by CMP processing. Surface scratching, which can be generated by CMP, is an extremely detrimental defect in semiconductor manufacturing. Hence, to achieve proper CMP performance without surface scratching, development of polishing compositions is crucially important. Requirements for CMP include planarized surfaces with planarity <15 nm, roughness free surfaces with surface roughness <1 nm, defect free surfaces with scratch and pit counts of 0 counts per wafer, are contamination free, have a high productivity, and are planarized with a high removal rate of the desired material to be removed.

Figure 1:
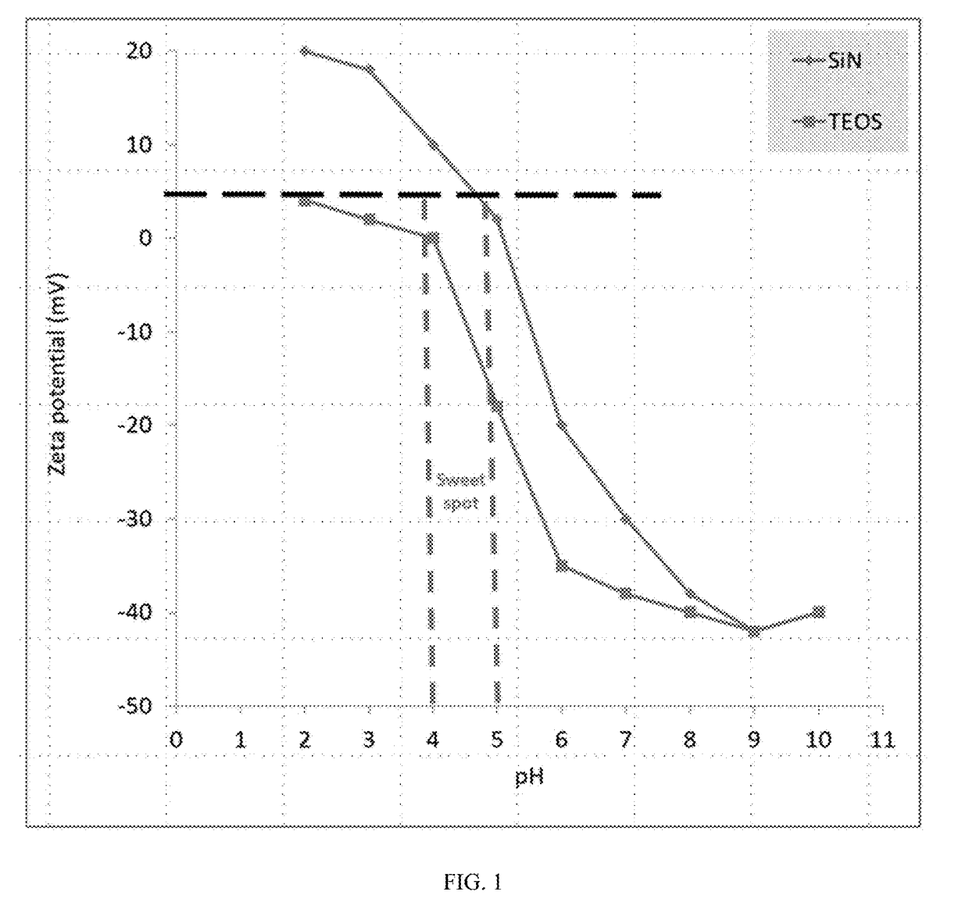
FIG. 1 shows zeta potential vs. pH for SiN and TEOS.

In polishing compositions for use with SiN- and TEOS-containing substrates, one key performance metric is a high SiN:TEOS removal rate selectivity, which provides minimal TEOS removal. Polishing compositions with high SiN:TEOS selectivity are ideally formulated at pH≤5, for at this pH opposite zeta potential signs of SiN and TEOS are observed. A graphical representation of the pH dependence of the zeta potential is provided in FIG. 1. Opposite signs of SiN (+) and TEOS (−) enable selection of a negatively charged abrasive particle, which results in increased SiN attraction and reduced TEOS repulsion. Optimum SiN:TEOS selectivity observed at the required pH (such as a pH=5) is thus due to the slightly positively charged SiN surface, a strongly negatively charged TEOS surface, and the resulting maximum repulsion from a negatively charged silica particle.

Figure 2:
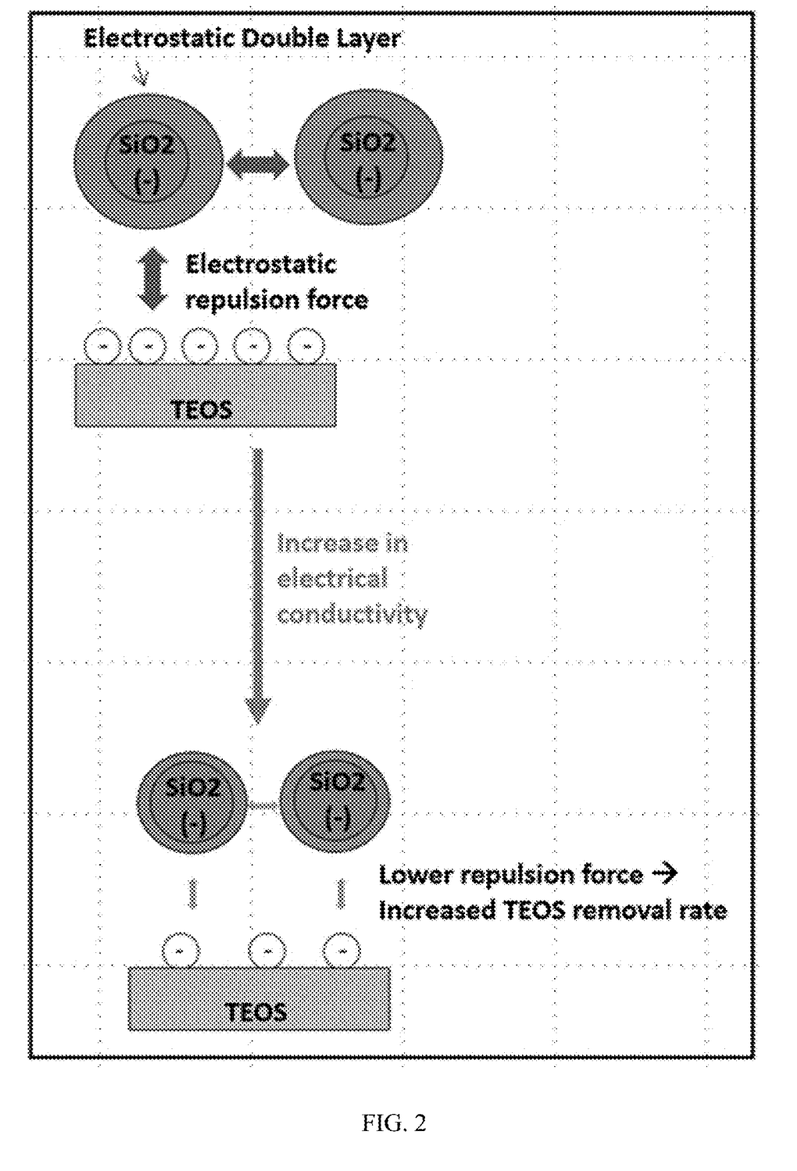
FIG. 2 shows the effect of EC on TEOS removal rate.

Electrical conductivity (EC) is also an important parameter for enabling the lowest possible TEOS removal rate. This is driven by mechanical force from the silica particle in the composition and the electrical conductivity affecting the electrostatic double layer around the silica particle. As the conductivity increases in a polishing composition, the electrostatic double layer gets thinner, resulting in a decrease of repulsion force between the silica particle and TEOS surface, or between silica particles. These changes enhance mechanical force and TEOS removal rate. A graphical representation of this effect is provided in FIG. 2.

In light of the complexity surrounding the various mechanisms of SiN and TEOS removal rates, it is critical to identify molecular entities enabling a high SiN removal rate, while simultaneously enabling a low TEOS removal rate, and thus providing high SiN:TEOS removal rate selectivity.

As described herein are SiN removal rate enhancers which are required to in order to obtain a sufficiently high SiN:TEOS removal rate selectivity. Also described herein is a mildly acidic SiN removal rate enhancer in a polishing composition with a pH in the range 4-6 (after addition of a typical silica particle with a pH in the range 5-7) enables the use of a minimal amount of pH adjustor (to obtaining a target pH=5) and the lowest possible electrical conductivity. It was determined that the use of excessive amount of salts, acids, or bases results in detrimental effects such as corrosion of metal layers that form part of the stack with TEOS and SiN, or etching of the substrate surface.

Without being bound by theory, it is believed that a strong interaction between the SiN removal rate enhancer and the SiN surface is required. On the SiN wafer film, the SiN bond is pulling the electron cloud away from the Si atom due to higher electronegativity of the N atom compared with the Si atom. This results in a reduced electron cloud around the Si atom and an enlarged electron cloud around the N atom. Thus, a SiN removal rate enhancer containing a free electron pair complexing with Si enables a weakened SiN bond, and thus easier removal. For a graphical representation of this interaction, see the schematics in FIGS. 3 and 4.

Thus, key aspects of the polishing compositions described herein include, but are not limited to: 1) high SiN:TEOS removal rate selectivity; 2) a strong interaction between the SiN removal rate enhancer with the SiN wafer surface (SiN removal rate enhancement); 3) a low electrical conductivity (resulting in TEOS removal rate suppression); 4) a key pH to keep the zeta potentials of the various components with the desired polarity; 5) minimal use of pH adjusting agent as more ions has a negative impact on the selectivity ratio.

1. SiN Removal Rate Enhancers

In one aspect, the polishing composition may comprise one or more SiN removal rate enhancers. The removal rate enhancers are 5- or 6-membered heteroaromatic ring systems with varying types of substitution.

In some embodiments, the SiN removal rate enhancers include 3-amino-1,2,4-triazole, 3-mercapto-1,2,4-triazole, aminopyrazine, 1,2,4-triazole, guanazole, 2,6-diamino-pyridine, 2,5-diamino-triazole, 1,3,4-thiadiazole-2,5-dithiol, 4-amino-4H-1,2,4-triazole, 2-amino-4,6-dimethypyridine, and 2,6-diaminopyridine. In some embodiments, the SiN removal rate enhancers include 3-isopropyl-1,2,4-triazole, 5-phenylthiol-benzotriazole, naphthotriazole, 2-mercaptobenzimidazole (MBI), 2-mercaptobenzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, and 5-amino-1,3,4-thiadiazole-2-thiol.

Figure 3:
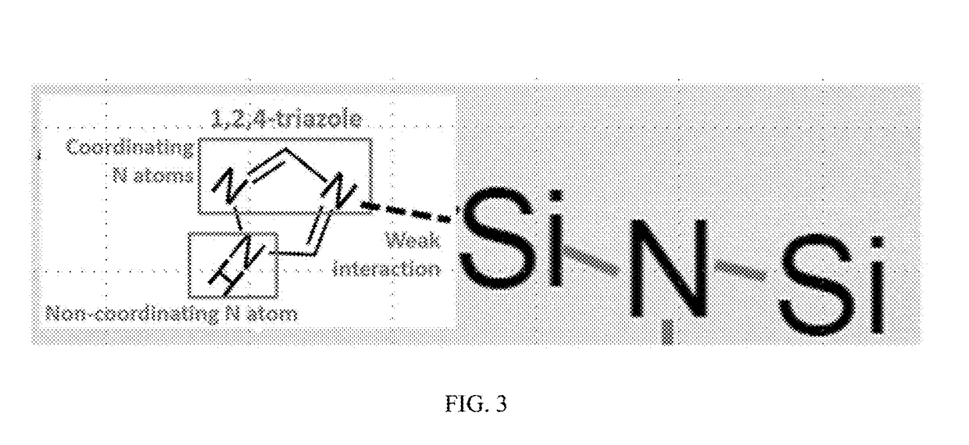
FIG. 3 shows a proposed model for additive interaction between 1,2,4-triazole and the SiN water surface.
Figure 4:
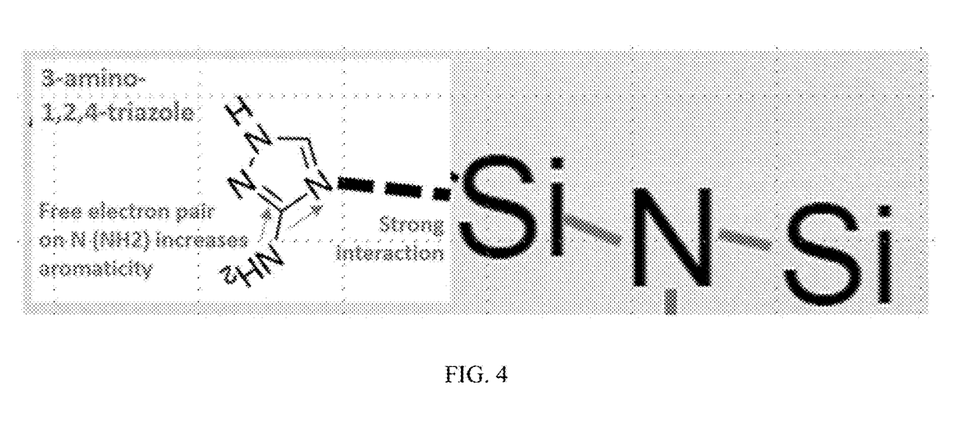
FIG. 4 shows a proposed model for additive interaction between 3-amino-1,2,4-triazole and the SiN water surface.

In an embodiment, the SiN removal rate enhancers are azoles. Without being bound by theory, azoles are good SiN removal rate enhancers due in part to the free electron pairs on complexing nitrogen or sulfur atoms on their ring structure. In addition, N- and S-containing substituents on the azoles furthers contribute to increased SiN removal rate by increasing the ring aromaticity. The proposed interaction between an SiN enhancer such as 1,2,4-triazole or 3-amino-1,2,4-triazole and the SiN wafer surface is shown in FIGS. 3 and 4.

In one embodiment, polishing compositions comprising 3-mercapto-1,2,4-triazole (3-MT) produced enabled high SiN:TEOS removal rate selectivity. The 3-MT is a mildly acidic SiN removal rate enhancer enabling compositions within the desired pH range (which in an embodiment is 4-4.5) prior to addition of the pH adjustor. This enables minimal use of the amount of pH adjustor required to reach the target pH, which subsequently results in the lowest possible EC and TEOS removal rate. Further, the 3-MT enables an increased SiN:TEOS selectivity due to a strong interaction with the SiN surface (SiN removal rate enhancement) combined with a low slurry EC (TEOS removal rate suppression).

The acidity and basicity of the heterocycles is a property that influences whether the heterocycle will function as a SiN removal rate enhancer. General categories of heterocycles are presented in Table 1.

TABLE 1

Type of SiN Enhancer and Effects on Composition at Final pH = 5.

| Type of SiN enhancer | Example(s) | Slurry pH* | Remark |
|---|---|---|---|
| Neutral or alkaline | Many amino acids, e.g., glycine and β-alanine | >6 | Significant amount of acid needed to reach target pH → high slurry EC. |
| Mildly acidic | Some heterocyclic N compounds, e.g., 3-mercapto-1,2,4-triazole | 4-6 | Lower amount of acid or base needed to reach target pH → Low Slurry EC |
| Acidic | Carboxylic, phosphonic, and sulfonic acids without an amino group. | <4 | Significant amount of base needed to reach target pH → High slurry EC |

*Before addition of pH adjustor.

One manner to obtain the required level of SiN:TEOS removal rate selectivity is for the SiN removal rate enhancer to remove the SiN layer at a sufficiently high rate. In one embodiment, a mildly acidic SiN removal rate enhancer enabled a polishing composition with a pH range of 4-6 (after addition of an abrasive such as a silica particle with a pH range of 5-7). More specifically, in some embodiments, the polishing compositions use a minimum amount of pH adjustor to obtain a target pH=5 and also having a low electrical conductivity. Examples of this are provided throughout the application, including Tables 2, 3, and 4. Conversely, the use of an excessive amount of salt (acid or base) results in detrimental effects such as low SiN:TEOS removal rate selectivity and corrosion of metal layers present in the substrate with TEOS and SiN layers.

The electrical conductivity for the polishing compositions described herein is from greater than zero to about 1.0 mS/cm. In some embodiments, the electrical conductivity is from greater than zero to about 0.75 mS/cm, from greater than zero to about 0.50 mS/cm, from greater than zero to about 0.25 mS/cm, from greater than zero to about 0.15 mS/cm, or from greater than zero to about 0.10 mS/cm. In some embodiments, the electrical conductivity is from about 0.01 mS/cm to about 1.0 mS/cm, from about 0.02 mS/cm to about 0.75 mS/cm, from about 0.03 mS/cm to about 0.50 mS/cm, from about 0.04 mS/cm to about 0.25 mS/cm, or from about 0.5 mS/cm to about 0.20 mS/cm. In some embodiments, the electrical conductivity is about 0.05, 0.06, 0.07, 0.08, 0.09, 0.10, 0.11, 0.12, 0.13, 0.14, 0.15, 0.16, 0.17, 0.18, 0.19, 0.20, 0.21, 0.22, 0.23, 0.24, or 0.25 mS/cm. In some embodiments, the upper limit of the electrical conductivity is about 0.25 mS/cm, about 0.20 mS/cm, about 0.18 mS/cm, about 0.16 mS/cm, about 0.14 mS/cm, about 0.12 mS/cm, about 0.10 mS/cm, about 0.08 mS/cm, or about 0.07 mS/cm.

Without being bound by theory, it is believed that the SiN removal rate enhancer needs to have certain structural features to provide good SiN:TEOS selectivities (i.e., a selectivity ratio ≥Slurry A (3-amino-1,2,4-triazole)). Specifically, the SiN removal rate enhancer needs to be a heteroaromatic compound containing at least one nitrogen where there are at least two atoms with a free electron pair capable of complexing with the SiN surface. The complexing atoms can be nitrogen or sulfur. Further, there must be at least one amino or thiol substituent bound to a carbon atom on the heteroaromatic ring. This combination of structural components enables SiN removal rates >180 Å/min.

Specific examples of SiN removal rate enhancers are divided into four groups for ease of characterization. In Group 1, the SiN removal rate enhancers provide a high SiN removal rate with a low TEOS removal rate. Compounds in Group 1 include 3-mercapto-1,2,4-triazole and aminopyrazine.

In Group 2 are compounds with a high SiN removal rate and a high TEOS removal rate. Compounds in Group 2 include 3,5-diamino-1,2,4-triazole (i.e., guanazole), 3-amino-1,2,4-triazole, and 1,3,4-thiadiazole-2,5-dithiol. It is believed that guanazole and 3-amino-1,2,4-triazole have a higher basicity, requiring more acid to bring the composition to the desired pH (such as pH=5), which leads to a high EC and results in a high TEOS removal rate. Conversely, it is believed that 1,3,4-thiadiazole-2,5-dithiol is too acidic, requiring more base to bring the composition to the desired pH (such as pH=5), which leads to a high EC and results in a high TEOS removal rate.

In Group 3 are compounds with a low SiN removal rate and a low TEOS removal rate. Compounds in Group 3 include triazole and 4-amino-4H-1,2,4-triazole. It is believed that triazole only has coordinating nitrogen in the heteroaromatic ring, and thus lacks the requisite amino or thiol substituent. For 4-amino-4H-1,2,4-triazole, this compound lacks an amino substituent bound to a carbon atom (as the amino substituent is bound to a nitrogen) and this molecular arrangement does not allow contribution to the aromaticity of the heteroaromatic ring by the amino substituent.

In Group 4 are compounds with a low SiN removal rate and a high TEOS removal rate. Compounds in Group 4 include 2-amino-4,6-dimethypyridine and 2,6-diaminopyridine. It is believed that for 2-amino-4,6-dimethypyridine, the two methyl groups reduce the aromaticity of the pyridine ring through a steric or other effect. For 2,6-diaminopyridine, this compound only has one coordinating nitrogen atom in the aromatic ring.

As specified herein, a high SiN removal rate corresponds to a SiN removal rate >180 Å/min while a high TEOS removal rate corresponds to a TEOS removal rate >7 Å/min. Further, the SiN removal rate enhancers described above are non-limiting examples of compounds in each group.

In some embodiments, the amount of SiN removal rate enhancer present in the polishing composition in a range from about 0.01 wt % to about 5 wt %, about 0.05 wt % to about 2.5 wt %, from about 0.1 wt % to about 1 wt %, or from about 0.25 wt % to about 0.75 wt %, based on the total amount of the polishing composition at 100 wt %. In some embodiments, the SiN removal rate enhancer is present in the polishing composition at about 0.01 wt % or more, about 0.05 wt % or more, about 0.1 wt % or more, about 0.2 wt % or more, about 0.25 wt % or more, about 0.5 wt % or more, about 0.75 w % or more, about 1 wt % or more, or about 3 wt % or more. Alternatively, or in addition, the amount of SiN removal rate enhancer in the polishing composition can be about 3 wt % or less, about 1 wt % or less, about 0.75 wt % or less, about 0.5 wt % or less, about 0.25 wt % or less, about 0.1 wt % or less, or about 0.05 wt % or less. In some embodiments, the amount of SiN removal rate enhancer is about 0.1 wt %, about 0.20 w %, about 0.25 wt %, about 0.30 wt %, about 0.40 wt %, about 0.5 wt %, about 0.60 wt %, about 0.70 wt %, about 0.75 wt %, about 0.80 wt %, about 0.90 wt %, about 1 wt %, about 2 wt %, or about 3 wt %.

2. pH Adjusting Agent

The polishing compositions of this disclosure optionally contain at least one pH adjusting agent to control the pH. In an embodiment, the pH adjusting agent is a basic compound. The basic compound may be appropriately selected from various basic compounds that have a function of raising the pH of polishing compositions in which the compounds are dissolved. For example, an inorganic basic compound such as an alkali metal hydroxide, an alkaline earth metal hydroxide, various carbonates, bicarbonates and the like may be used. Such basic compounds may be used singly or in combination of two or more types thereof.

Specific examples of the alkali metal hydroxide include potassium hydroxide, sodium hydroxide, ammonium hydroxide, and the like. Specific examples of the carbonate and bicarbonate include ammonium hydrogen carbonate, ammonium carbonate, potassium hydrogen carbonate, potassium carbonate, sodium hydrogen carbonate, sodium carbonate and the like.

In alternate embodiments, the pH adjusting agent may be acidic in nature. The choice of acid is not particularly limited provided that the strength of the acid is sufficient to lower the pH of the polishing composition of the present invention.

The acidic pH adjuster may be an inorganic acid or an organic acid. For example, and without limitation, such inorganic acids include hydrochloric acid, sulfuric acid, nitric acid, boric acid, carbonic acid, hypophosphorous acid, phosphorous acid, and phosphoric acid.

For example, and without limitation, such organic acids include formic acid, acetic acid, chloroacetic acid, propionic acid, butanoic acid, valeric acid, 2-methylbutyric acid, N-hexanoic acid, 3,3-dimethylbutanoic acid, 2-ethylbutanoic acid, 4-methylpentanoic acid, n-heptanoic acid, 2-methyl hexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citrate, citric acid, lactic acid, diglycolic acid, 2-furancarboxylic acid, 3-furancarboxylic acid, 2-tetrahydro furancarboxylic acid, methoxy acetic acid, methoxyphenyl acetic acid, and phenoxyacetic acid. Such organic acids also include, without limitation, organic sulfonic acid, such as methanesulfonic acid, ethane sulfonic acid, and isethionic acid.

The pH adjusting agent may be a mixture of an acidic agent and basic agent (such as a buffer).

In an embodiment, the pH of the polishing vehicle or polishing composition is adjusted to a range that is from about 3.0 to about 7.0, from about 4.0 to about 6.0, from about 4.25 to about 5.75, from about 4.5 to about 5.5, or from about 4.25 to about 5.25. In some embodiments, the pH is less than about 6.0, less than about 5.5, less than about 5.0, less than about 4.5, or less than about 4.0. In some embodiments, the pH is about 3.5, 3.75, 4.0, 4.25, 4.5, 4.75, 5.0, 5.25, 5.5, 5.75, or 6.0. In some embodiments, the pH is more than about 3.5, more than about 4.0, more than about 4.5, more than about 5.0, or more than about 5.5.

The pH adjusting agent may be present at a specific concentration range, regardless of pH. For example, in some embodiments, the amount of pH adjusting agent is in a range from about 0.0001 wt % to about 1 wt %, from about 0.005 wt % to about 0.5%, or from about 0.001 wt % to about 0.1 wt %. In alternate embodiments, the amount of pH adjusting agent is in a range from about 0.0001 wt % to about 0.0010 wt %, from about 0.0003 wt % to about 0.0009 wt %, or from about 0.0005 wt % to about 0.0008 wt %. In alternate embodiments, the amount of pH adjusting agent is in a range from about 0.0009 wt % to about 0.0040 wt % or from about 0.0010 wt % to about 0.0030 wt %. In still alternate embodiments, the pH adjusting agent is in a range from about 0.001 wt % to about 0.01 wt %. In some embodiments, the amount of pH adjusting agent is present in an amount of at least about 0.0001 wt %, at least about 0.0005 wt %, at least about 0.001 wt %, at least about 0.005 wt %, at least about 0.01 wt %, at least about 0.025 wt %, at least about 0.05 wt %, at least about 0.075 wt %, or at least about 0.1 wt %. In some embodiments, the pH adjusting agent is present in an amount of less than about 0.01 wt %, less than about 0.005 wt %, less than about 0.001 wt %, or less than about 0.0005 wt %. In some embodiments, the pH adjusting agent is present in an amount that is about 0.0001 wt %, about 0.00025 wt %, about 0.0005 wt %, about 0.0006 wt %, about 0.0007 wt %, about 0.0008 wt %, about 0.0009 wt %, about 0.001 wt %, about 0.005 wt %, about 0.0075 wt %, about 0.01 wt %, about 0.025 wt %, or about 0.05 wt %.

As previously indicated, the polishing compositions cannot use too much pH adjusting agent, as the amount of ions will have a negative effect on the selectivity ratio. This limits the type of pH adjusting agent as well.

3. Abrasive

The polishing composition described herein contains an abrasive. The abrasive is typically a metal oxide abrasive preferably selected from the group consisting of silica, alumina, titania, zirconia, germania, ceria and mixtures thereof. In some embodiments, the abrasive is silica. In a further embodiment, the abrasive is colloidal silica.

In some embodiments, the abrasive is surface modified. For example, the abrasive may be surface-modified silica. As used herein, the term "surface-modified silica" refers to a silica that is covalently bonded to a modifying moiety.

In one embodiment, the surface-modified colloidal silica particle comprises silica derivatized with organic acids or salts thereof. In some embodiments, the acid moieties of the surface-modified colloidal silica particles are selected from carboxylic acids and sulfonic acids.

Methods of covalently attaching such organic acids to the silica such that a functional group of the organic acids is bound to the silica will be understood by the skilled artisan. For example, in the case of covalently attaching a sulfonic acid to the colloidal silica, see Cano-Serrano et al., "Sulfonic acid-functionalized silica through quantitative oxidation of thiol groups," *Chem. Commun.*, 2003, 246-247. Specifically, the colloidal silica in which sulfonic acids are covalently attached to its surface is obtained by coupling silane coupling agents having a thiol group such as (3-mercaptopropyl) trimethoxysilane with the colloidal silica and then oxidizing the thiol group using a hydrogen peroxide in water. In the case of covalently attaching a carboxylic acid to the colloidal silica, see Yamaguchi et al., "Novel silane coupling agents containing a photolabile 2-nitrobenzyl ester for introduction of a carboxy group," *Chemistry Letters*, 3, 228-229 (2000). Specifically, the colloidal silica in which a carboxylic acid is covalently attached to its surface is obtained by coupling silane coupling agents containing photosensitive 2-nitrovinyl ester with the colloidal silica and then irradiating it by light. In an embodiment, the modifying moiety is a sulfonic acid.

In an embodiment, the abrasive is colloidal silica. In a further embodiment, the abrasive has a negative zeta potential. In still further embodiments, the abrasive is silica with a negative zeta potential when in the polishing composition. The negative zeta potential may be in the range from about −10 mV to about −70 mV, from about −20 mV to about −60 mV, or from about −30 mV to about −50 mV. In some embodiments, the negative zeta potential is about −10 mV, about −15 mV, about −20 mV, about −25 mV, about −30 mV, about −35 mV, about −40 mV, about −45 mV, about −50 mV, about −55 mV, about −60 mV, about −65 mV, or about −70 mV.

The abrasive can have any suitable particle size. The abrasive can have an average secondary particle size of about 10 nm or more, about 25 nm or more, 50 nm or more, about 100 nm or more, or about 500 nm or more. Alternatively, or in addition, the abrasive can have an average secondary particle size of about 1,000 nm or less, about 500 nm or less, about 200 nm or less, about 150 nm or less, about 100 nm or less, about 50 nm or less, or about 25 nm or less. For example, in some embodiments, the abrasive can have an average secondary particle size in a range from about 10 nm to about 500 nm, from about 20 nm to about 100 nm, or from about 30 nm to about 50 nm. In some embodiments, the average secondary particle size is about 10 nm, about 15 nm, about 20 nm, about 25 nm, about 30 nm, about 35 nm, about 40 nm, about 45 nm, about 50 nm, about 75 nm, or about 100 nm. The average particle size of the abrasive can be measured by a particle size analyzer (Horiba Particle Size Distribution tool).

In some embodiments, the amount of abrasive in the polishing composition is about 0.01 wt % or more, about 0.05 wt % or more, about 0.1 wt % or more, about 0.2 wt % or more, about 0.25 wt % or more, about 0.5 wt % or more, about 0.75 w % or more, about 1 wt % or more, about 3 wt % or more, or about 5 wt % or more. Alternatively, or in addition, the amount of abrasive in the polishing composition can be about 5 wt % or less, about 3 wt % or less, about 1 wt % or less, about 0.75 wt % or less, about 0.5 wt % or less, about 0.25 wt % or less, about 0.1 wt % or less, about 0.05 wt % or less, about 0.01 wt % or less, or about 0.05 wt % or less. In some embodiments, the amount of abrasive in the polishing composition can be in a range from about 0.01 wt % to about 5 wt %, about 0.05 wt % to about 3 wt %, from about 0.1 wt % to about 2.5 wt %, from about 0.25 wt % to about 2 wt %, or from about 0.5 wt % to about 1 wt %. In some embodiments, the amount of abrasive is about 0.1 wt %, about 0.25 wt %, about 0.5 wt %, about 0.75 wt %, about 1 wt %, about 2 wt %, about 3 wt %, about 4 wt %, or about 5 wt %.

While the abrasive can be of any reasonable size, the size of the abrasive influences the smoothness of the finish obtained. Precision polishing operations materials such as optical components, plastics, metals, gemstones, semiconductor components, and the like typically involve the use of abrasives with smaller sizes. For example, compositions for use in connection with precision polishing involve suspensions of abrasives with smaller average particle sizes.

In an embodiment, the abrasive is colloidal silica. In some embodiments, the abrasive substantially comprises colloidal silica. As used herein, "substantially" means that 95% by weight or more, preferably 98% by weight or more, more preferably, 99% by weight or more of the particles constituting the abrasive are colloidal silica, and it includes that 100% by weight of the particles are colloidal silica.

4. Sulfonic Acid

In an embodiment, the polishing compositions disclosed herein contain a sulfonic acid. The sulfonic acid is an organic sulfonic acid that may be an aliphatic or aromatic sulfonic acid.

Non-limiting examples of the aliphatic sulfonic acid include methanesulfonic acid, ethanesulfonic acid, propanesulfonic acid, butanesulfonic acid, hexanesulfonic acid, 3-(N-morpholino)propane sulfonic acid (MOPS), 2-(N-morpholino)ethanesulfonic acid (MES), N-cyclohexyl-2-aminoethanesulfonic acid (CHES), 3-[4-(2-hydroxyethyl)-1-piperazinyl]propanesulfonic acid (HEPPS), (4-2-hydroxyethyl)-1-piperazineethanesulfonic acid (HEPES) and N-cyclohexyl-3-aminopropanesulfonic acid (CAPS).

Non-limiting examples of aromatic sulfonic acids include C6-16 aryl sulfonic acids and C6-16 heteroaryl sulfonic acids such as phenyl sulfonic acid, naphthalene sulfonic acid (such as naphthalene-2-sulfonic acid and naphthalene-1-sulfonic acid), and camphorsulfonic acid. In an embodiment, the sulfonic acid is naphthalene sulfonic acid. In a further embodiment, the sulfonic acid is naphthalene-2-sulfonic acid. In an embodiment, the sulfonic acid is commercially available under the trade name of Pionin A44-TW which contains naphthalene sulfonic acid, sodium salt, isopropylated (0.00066 wt %) and methanol (0.00026 wt %).

The sulfonic acid may be present at a specific concentration range. For example, in some embodiments, the amount of sulfonic acid is in a range from about 0.0001 wt % to about 0.005 wt % or from about 0.0005 wt % to about 0.001 wt %. In alternate embodiments, the amount of sulfonic acid is in a range from about 0.0001 wt % to about 0.0010 wt %, from about 0.0003 wt % to about 0.0009 wt %, or from about 0.0005 wt % to about 0.0008 wt %. In some embodiments, the amount of sulfonic acid is present in an amount of at least about 0.0001 wt %, at least about 0.0005 wt %, or at least about 0.001 wt %. In some embodiments, the sulfonic acid is present in an amount of less than about 0.005 wt %, less than about 0.001 wt %, or less than about 0.0005 wt %. In some embodiments, the sulfonic acid is present in an amount that is about 0.0001 wt %, about 0.00025 wt %, about 0.0005 wt %, about 0.0006 wt %, about 0.0007 wt %, about 0.0008 wt %, about 0.0009 wt %, about 0.001 wt %, or about 0.005 wt %.

The aromatic or aliphatic sulfonic acids may be used to adjust the pH value. In addition, the sulfonic acids may also contribute to the removal of metal-containing residues, by the formation of stabilizing coordination bonds. Further, the sulfonic acids do not damage low-K materials and are good stabilizers of oxidizing agents such as $H_2O_2$.

5. Water

In an embodiment, the polishing compositions disclosed herein contain a carrier, medium, or vehicle. In an embodiment, the carrier, medium, or vehicle is water. Ion exchanged water (deionized water), pure water, ultrapure water, distilled water and the like may be used as the water. In order to reduce the amount of unwanted components present in the water, the purity of water may be increased by operations such as removal of impurity ions with an ion exchange resin, removal of contaminants with a filter, and/or distillation.

In some embodiments, the water is relatively free of impurities. In some embodiments, the water contains less than about 10% w/w, about 9% w/w, about 8% w/w, about 7% w/w, about 6% w/w, about 5% w/w, about 4% w/w, about 3% w/w, about 2% w/w, about 1% w/w, about 0.9% w/w, about 0.8% w/w, about 0.7% w/w, about 0.6% w/w, about 0.5% w/w, about 0.4% w/w, about 0.3% w/w, or less than about 0.1% w/w of impurities based on the total weight of the water.

6. Additional Components

In an embodiment, the polishing compositions disclosed herein may contain additional components such as corrosion inhibitors, oxidizers, polysaccharides, chelating agent, biocides, surfactants, or co-solvents. Additionally or alternatively, the compositions disclosed herein can include other additives as will be understood by those skilled in the art.

In another embodiment, the additional component may include a corrosion inhibitor. Non-limiting examples of the corrosion inhibitor may include 2-methyl-3-butyn-2-ol, 3-methyl-2-pyrazolin-5-one, 8-hydroxyquinoline, and dicyandiamide, benzotriazole and its derivatives, pyrazole and its derivatives, imidazole and its derivatives, benzimidazole and its derivatives, isocyanurate and its derivatives, and mixtures thereof. The amount of corrosion inhibitor in the polishing composition may range from about 0.0005 wt % to 0.25 wt %, preferably from 0.0025 wt % to 0.15 wt %, and more preferably from 0.05 wt % to 0.1 wt % of corrosion inhibitor.

In an alternative embodiment, the polishing composition is corrosion inhibitor agent free. The term "corrosion inhibitor agent free" as used herein means that the polishing composition does not contain compounds known in the art to be used as corrosion inhibitors.

In another embodiment, the additional component may include an oxidizer. Non-limiting examples of the oxidizer include periodic acid, hydrogen peroxide, potassium iodate, potassium permanganate, persulfate salts (e.g., ammonium persulfate and potassium dipersulfate), periodate salts (e.g., potassium periodate), ammonium molybdate, ferric nitrate, nitric acid, potassium nitrate, and mixtures thereof. The amount of oxidizer may range from about 0.1 wt % to about 10 wt %, from about 0.25 wt % to about 3 wt %, or from about 0.5 wt % to about 1.5 wt %.

In an alternative embodiment, the polishing composition is oxidizer free. The term "oxidizer free" as used herein means that the polishing composition does not contain compounds known in the art to be used as corrosion inhibitors.

In one embodiment, the carbohydrate is a polysaccharide known as pullulan. The polysaccharide pullulan is comprised of maltotriose units consisting of three α-1,4-linked glucose molecules are further linked by α-1,6-bonds. In an embodiment, pullulan has a weight average molecular weight ranging from 10,000 to 1,000,000. In some embodiments, the concentration of pullulan is present in the polishing composition in a range from about 0.01 wt % to about 0.05 wt %, such as about 0.02 wt %.

In an alternative embodiment, the polishing composition is carbohydrate free. The term "carbohydrate free" as used herein means that the polishing composition does not contain compounds known in the art as carbohydrates.

In another embodiment, the additional component may include a chelating agent. The term chelating agent is intended to mean any substance that in the presence of an aqueous solution chelates metals, such as copper. Non-limiting examples of chelating agents include inorganic acids, organic acids, amines, and amino acids such as glycine, alanine, citric acid, acetic acid, maleic acid, oxalic acid, malonic acid, phthalic acid, succinic acid, nitrilotriacetic acid, iminodiacetic acid, ethylenediamine, CDTA, and EDTA.

In an alternative embodiment, the polishing composition is chelating agent free. The term "chelating agent free" as used herein means that the polishing composition does not contain compounds known in the art as chelating agents. Non-limiting examples of chelating agents include compounds such as glycine, alanine, citric acid, acetic acid, maleic acid, oxalic acid, malonic acid, phthalic acid, succinic acid, nitrilotriacetic acid, iminodiacetic acid, ethylenediamine, CDTA, and EDTA.

In an embodiment, the additional component may be a biocide. Non-limiting examples of biocides include hydrogen peroxide, quaternary ammonium compounds, and chlorine compounds. More specific examples of the quaternary ammonium compounds include, but are not limited to, methylisothiazolinone, tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms. More specific examples of the chlorine compounds include, but are not limited to, sodium chlorite and sodium hypochlorite. Additional examples of biocides include biguanide, aldehydes, ethylene oxide, isothiazolinone, iodophor, KATHON™ and NEOLENE™ product families that are commercially available from Dow chemicals, and the Preventol™ family from Lanxess. The amount of biocide used in the polishing composition may range from about 0.0001 wt % to 0.10 wt %, preferably from 0.0001 wt % to 0.005 wt %, and more preferably from 0.0002 wt % to 0.0025 wt %.

In another embodiment, the additional component may include a surfactant. The surfactants may be anionic, cationic, nonionic, or zwitterionic and may increase lubricity of the vehicle or compositions. Non-limiting examples of the surfactants are dodecyl sulfates, sodium salts or potassium salts, lauryl sulfates, secondary alkane sulfonates, alcohol ethoxylate, acetylenic diol surfactant, quaternary ammonium-based surfactants, amphoteric surfactants, such as betaines and amino acid derivatives-based surfactants, and any combination thereof. Examples of suitable commercially available surfactants include TRITON™, TERGITOL™, DOWFAX™ family of surfactants manufactured by Dow Chemicals and various surfactants in SURFYNOL™ DYNOL™, ZETASPERSE™, NONIDET™, and TOMADOL™ surfactant families, manufactured by Air Products and Chemicals. Suitable surfactants of surfactants may also include polymers comprising ethylene oxide (EO) and propylene oxide (PO) groups. An example of EO-PO polymer is TETRONIC™ 90R4 from BASF Chemicals. An example of acetylenic diol surfactant is DYNOL™ 607 from Air Products and Chemicals. The amount of surfactant used in the polishing composition may range from about 0.0005 wt % to 0.15 wt %, preferably from 0.001 wt % to 0.05 wt %, and more preferably from 0.0025 wt % to 0.025 wt %.

In another embodiment, the additional component may include another solvent, termed a co-solvent. Non-limiting examples of co-solvents include, but are not limited to, alcohol (such as methanol or ethanol), ethyl acetate, tetrahydrofuran, alkanes, tetrahydrofuran, dimethylformamide, toluene, ketones (such as acetone), aldehydes, and esters. Other non-limiting examples of co-solvents include dimethyl formamide, dimethyl sulfoxide, pyridine, acetonitrile, glycols, and mixtures thereof. The co-solvent may be employed in various amounts, preferably from a lower limit of about 0.0001, 0.001, 0.01, 0.1, 0.5, 1, 5, or 10% (wt %) to an upper limit of about 0.001, 0.01, 0.1, 1, 5, 10, 15, 20, 25, or 35% (wt %).

As described herein, the polishing compositions have specific properties, which are greatly influenced by the components in the composition, both in type and amount. Thus, certain materials may need to be excluded from the composition in order to maintain the desired properties. Non-limiting examples of materials known in the art which may need to be excluded from the currently disclosed polishing composition in order to provide the required properties (such as zeta potential, EC, and/or SiN:TEOS removal rate ratio) include barrier layer removal agents and selectivity additives.

Accordingly, as described herein in some embodiments are polishing compositions comprising an abrasive, a SiN removal rate enhancer, a pH adjusting agent, and water, wherein the abrasive is anion-modified silica wherein a surface of the anion-modified silica has sulfonic acid groups covalently attached; the SiN removal rate enhancer is a substituted 5- or 6-membered heterocycle, wherein the heterocyclic ring comprises at least two nitrogen atoms and the heterocycle is substituted with at least one group selected from —$NH_2$ and —SH; and the polishing composition has a pH from about 4 to about 6.

As in any embodiment above, a polishing composition wherein the electrical conductivity from greater than zero to about 0.25 mS/cm.

As in any embodiment above, a polishing composition wherein the SiN removal rate enhancer is monosubstituted with a —$NH_2$ or —SH.

As in any embodiment above, a polishing composition wherein the SiN removal rate enhancer is a triazole.

As in any embodiment above, a polishing composition wherein the SiN removal rate enhancer is a pyrazine.

As in any embodiment above, a polishing composition wherein the SiN removal rate enhancer is selected from the group consisting of 3-mercapto-1,2,4-triazole, 3-amino-1,2,4-triazole, aminopyrazine, and combinations thereof.

As in any embodiment above, a polishing composition wherein the SiN removal rate enhancer is 3-mercapto-1,2,4-triazole.

As in any embodiment above, a polishing composition wherein the abrasive has a negative zeta potential in a range from about −30 mV to about −50 mV.

As in any embodiment above, a polishing composition further comprising a sulfonic acid present in a concentration from about 0.0001 wt % to about 0.005 wt %.

As in any embodiment above, a polishing composition wherein the sulfonic acid is naphthalene sulfonic acid, sodium salt.

As in any embodiment above, a polishing composition wherein the polishing composition has a SiN:TEOS removal rate selectivity ratio of at least 40.

As in any embodiment above, a polishing composition wherein the SiN removal rate enhancer is present in a concentration from about 0.1 wt % to about 1 wt %.

As in any embodiment above, a polishing composition wherein the pH adjusting agent is present in a concentration from about 0.0001 wt % to about 0.5 wt %.

As in any embodiment above, a polishing composition wherein the pH adjusting agent is selected from the group consisting of maleic acid, sodium hydroxide, potassium hydroxide, and ammonium hydroxide.

As in any embodiment above, a polishing composition wherein the pH adjusting agent is ammonium hydroxide and is present in a concentration from about 0.0001 wt % to about 0.1 wt %.

As in any embodiment above, a polishing composition wherein the pH adjusting agent is potassium hydroxide and is present in a concentration from about 0.0001 wt % to about 0.1 wt %.

As in any embodiment above, a polishing composition wherein the abrasive is present in a concentration from about 0.1 wt % to about 2.5 wt %.

As in any embodiment above, a polishing composition comprising: 3-mercapto-1,2,4-triazole present in a concentration at about 0.5 wt %, ammonium hydroxide present in a concentration at about 0.0006 wt %, abrasive present in present in a concentration at about 0.75 wt %, and naphthalene sulfonic acid, sodium salt present in a concentration at about 0.0009 wt %, wherein the pH of the polishing composition is between about 4.5 and about 5.5.

As in any embodiment above, a polishing composition comprising: 3-mercapto-1,2,4-triazole present in a concentration at about 0.5 wt %, potassium hydroxide present in a concentration at about 0.02 wt %, abrasive present in present in a concentration at about 0.75 wt %, and naphthalene sulfonic acid, sodium salt present in a concentration at about 0.0009 wt %, wherein the pH of the polishing composition is between about 4.5 and about 5.5.

As in any embodiment above, a polishing composition comprising: aminopyrazine present in a concentration at about 0.5 wt %, maleic acid present in a concentration at about 0.0075 wt %, abrasive present in present in a concentration at about 0.75 wt %, and naphthalene sulfonic acid, sodium salt present in a concentration at about 0.0009 wt %, wherein the pH of the polishing composition is between about 4.5 and about 5.5.

C. METHODS OF USING THE POLISHING COMPOSITIONS

The polishing compositions described herein are useful for polishing any suitable substrate. In an embodiment, the substrate to be polished can be any suitable substrate, which comprises at least one layer of SiN. Suitable substrates include, but are not limited to, flat panel displays, integrated circuits, memory or rigid disks, metals, interlayer dielectric (ILD) devices, semiconductors, microelectromechanical systems, ferroelectrics, and magnetic heads.

As another example, the polishing composition can be used to polish a substrate comprising a silicon oxide layer. In another embodiment, the polishing composition can be used to polish a substrate comprising a silicon layer. Suitable substrates include, but are not limited to, flat panel displays, integrated circuits, memory or rigid disks, metals, semiconductors, ILD devices, microelectromechanical systems (MEMS), ferroelectrics, and magnetic heads.

The substrate can further comprise at least one other layer, e.g., an insulating layer. The insulating layer can be a metal oxide, porous metal oxide, glass, organic polymer, fluorinated organic polymer, or any other suitable high or low-K insulating layer. The insulating layer can comprise, consist essentially of, or consist of silicon oxide, SiN, or combinations thereof. The silicon oxide layer can comprise, consist essentially of, or consist of any suitable silicon oxide, many of which are known in the art. For example, the silicon oxide layer can comprise tetraethoxysilane (TEOS), high density plasma (HDP) oxide, borophosphosilicate glass (BPSG), high aspect ratio process (HARP) oxide, spin on dielectric (SOD) oxide, chemical vapor deposition (CVD) oxide, plasma-enhanced tetraethyl ortho silicate (PETEOS), thermal oxide, or undoped silicate glass. The substrate can further comprise a metal layer. In a specific embodiment, the silicon oxide layer is tetraethoxysilane (TEOS). The metal can comprise, consist essentially of, or consist of any suitable metal, many of which are known in the art, such as, for example, copper, tantalum, tungsten, titanium, platinum, ruthenium, iridium, aluminum, nickel, or combinations thereof.

The subject matter disclosed herein also comprises a method for polishing a substrate with the polishing compositions described herein. The method of polishing a substrate comprises: (a) providing a substrate, (b) providing a polishing composition described herein, (c) applying the polishing composition to at least a portion of the substrate, and (d) abrading at least a portion of the substrate with the polishing composition to polish the substrate.

In the method of polishing a substrate, the polishing compositions disclosed herein have a SiN removal rate of at least about 100 Å/min; at least about 150 Å/min; at least about 180 Å/min; at least about 200 Å/min; at least about 250 Å/min; at least about 300 Å/min; or at least about 500 Å/min. In some embodiments, the SiN removal rate is in a range from about 100 Å/min to about 500 Å/min; from about 150 Å/min to about 300 Å/min; or from about 180 Å/min to about 250 Å/min. In some embodiments, the SiN removal rate is about 100 Å/min, about 150 Å/min, about 180 Å/min, about 200 Å/min, about 250 Å/min, or about 300 Å/min.

In the method of polishing a substrate, the polishing compositions disclosed herein have a TEOS removal rate of less than about 10 Å/min; less than about 9 Å/min; less than about 8 Å/min; less than about 7 Å/min; less than about 6 Å/min; less than about 5 Å/min; less than about 4 Å/min; less than about 3 Å/min; or less than about 2 Å/min. In some embodiments, the TEOS removal rate is in a range from about 1 Å/min to about 10 Å/min; from about 2 Å/min to about 9 Å/min; from about 3 Å/min to about 8 Å/min; or from about 4 Å/min to about 7 Å/min. In some embodiments, the SiN removal rate is about 10 Å/min, about 9 Å/min, about 8 Å/min, about 7 Å/min, about 6 Å/min, about 5 Å/min, about 4 Å/min, about 3 Å/min, or about 2 Å/min.

In the method of polishing a substrate, the polishing compositions disclosed herein have a SiN:TEOS removal rate ratio of greater than about 30, about 35, about 40, about 45, about 50, about 55, about 60, about 65, about 70, about 75, or about 100. In some embodiments, the SiN:TEOS removal rate ratio is in a range from about 30 to about 100, from about 40 to about 75, or from about 45 to about 60. In some embodiments, the SiN:TEOS removal rate ratio is about 30, about 35, about 40, about 45, about 50, about 55, or about 60.

The SiN:TEOS removal rate is measured using; an IC1010 (DuPont) as a polishing pad, A165 as a diamond dresser, and Westech chemical mechanical polisher under conditions of 1.5 psi; 69 rpm; 125 ml/min. SiN and TEOS thicknesses are measured with an F50 thin film mapper optical measurement tool (manufacturer: Filmetrics). The thicknesses are measured before and after polishing and the removal rate is determined with the ratio (wafer thickness before polishing)/(wafer thickness after polishing).

Accordingly, as described herein in some embodiments are methods of using the polishing compositions, where the methods comprise the steps of: a) providing the polishing composition of claim 1; b) providing a substrate, wherein the substrate comprises a SiN layer; and c) polishing the substrate with the polishing composition to provide a polished substrate.

As in any embodiment above, a method wherein the substrate is a semiconductor.

As in any embodiment above, a method wherein the substrate further comprises a silicon oxide layer.

As in any embodiment above, a method wherein the method results in a SiN:TEOS removal rate selectivity ratio of greater than about 40.

As in any embodiment above, a method wherein the polished substrate has a planarity of less than about 15 nm and a surface roughness of less than about 1 nm.

As in any embodiment above, a method wherein the method results in a SiN removal rate of at least about 180 Å/min.

As in any embodiment above, a method wherein the silicon oxide layer is made from tetratethylorthosilicate (TEOS) and the method results in a TEOS layer removal rate of less than about 5 Å/min.

D. EXAMPLES

The following preparations and examples are given to enable those skilled in the art to more clearly understand and to practice the present invention. They should not be considered as limiting the scope of the invention, but merely as being illustrative and representative.

In one aspect, disclosed are methods of making the polishing compositions. In another aspect are disclosed methods of using the polishing compositions to polish materials.

Example 1: Formulation Examples

A molecular commonality enabling a high SiN removal rate while simultaneously enabling a low TEOS removal rate for a high SiN:TEOS removal rate selectivity was identified. Specifically, in an embodiment, 3-mercapto-1,2,4-triazole (3-MT) was identified as the SiN removal rate enhancer enabling high SiN:TEOS selectivity. 3-MT is a mildly acidic SiN enhancer enabling slurry formulations within the pH range 4-4.5 prior to addition of pH adjustor (base). This enables minimization of the pH adjustor amount required to reach target pH, subsequently resulting in the lowest possible slurry EC and TEOS removal rate.

TABLE 2

Formulation Details (pH = 5).

| Component | Concentrations (wt %) at PoU | | |
|---|---|---|---|
| | Slurry E | Slurry H | Slurry I |
| Colloidal silica (Particle A) | 0.75 | 0.75 | 0.75 |
| 3-mercapto-1,2,4-triazole (3-MT) | 0.5 | 0.5 | 0.5 |
| Napthtalenesulfonic acid, sodium salt, isopropylated (Pionin A44-TW) | 0.00066 | 0.00066 | 0.00066 |
| Methanol | 0.00026 | 0.00026 | 0.00026 |
| Potassium hydroxide | 0.00171 | — | — |
| Ammonium hydroxide | — | 0.00063 | 0.00061 |
| Pullulan | — | 0.02 | — |
| DI water | Remainder | Remainder | Remainder |
| Total | 100 | 100 | 100 |

The SiN removal rate enhancer 3-mercapto-1,2,4-triazole enables an increased SiN:TEOS selectivity due to a strong interaction with the SiN surface (SiN removal rate enhancement) combined with a low composition EC (TEOS removal rate suppression).

Example 2: SiN Removal Rate Enhancers

Several SiN enhancers were evaluated. The same molarity of SiN enhancers were added to each formulation (the difference in wt % is due to different molecular weights).

TABLE 3

Ingredients in representative polishing compositions (i.e., slurries) (all at pH 5).

| Slurry | Particle (amount wt %) | SiN enhancer (PoU amount) | Pionin A44-TW** | pH adjustor (amount) |
|---|---|---|---|---|
| Slurry A | Particle A (0.75) | 3-amino-1,2,4-triazole (0.50 wt %) | 0.00092 | Maleic acid (0.0065 wt %) |
| Slurry B | Particle A (0.75) | 2-amino-4,6-dimethyl pyridine (0.8 wt %) | 0.00092 | Maleic acid (0.68 wt %) |
| Slurry C | Particle A (0.75) | 2,6-diamino-pyridine (0.66 wt %) | 0.00092 | Maleic acid (0.51 wt %) |
| Slurry D | Particle A (0.75) | 4-amino-4H-triazole (0.42 wt %) | 0.00092 | Maleic acid (0.0081 wt %) |
| Slurry E | Particle A (0.75) | 3-mercapto-1,2,4-triazole (0.5 wt %) | 0.00092 | Potassium hydroxide (0.017 wt %) |
| Slurry F | Particle A (0.75) | Guanazole (0.49 wt %) | 0.00092 | Maleic acid (0.72 wt %) |
| Slurry G | Particle A (0.75) | Amino-pyrazine (0.48 wt %) | 0.00092 | Maleic acid (0.0076 wt %) |
| Slurry H* | Particle A (0.75) | 3-mercapto-1,2,4-triazole (0.5 wt %) | 0.00092 | Ammonium hydroxide (0.00063 wt %) |
| Slurry I | Particle A (0.75) | 3-mercapto-1,2,4-triazole (0.5 wt %) | 0.00092 | Ammonium hydroxide (0.00061 wt %) |
| Slurry J | Particle B (0.75) | 3-mercapto-1,2,4-triazole (0.5 wt %) | 0.00092 | Ammonium hydroxide (0.00183 wt %) |

*Also contains 0.02 wt % pullulan in addition to the other listed ingredients.

**Pionin A44-TW contains 0.00066 wt % napthalene sulfonic acid, sodium salt, isopropylated and 0.00026 wt % methanol.

Example 3—Removal Rates and EC Measurements

TABLE 4

SiN and TEOS Removal Rates.

| | | SiN enhancer properties of heterocyclic N compounds | | Removal rates (A/min) | | SiN:TEOS selectivity |
|---|---|---|---|---|---|---|
| Slurry*** | PoU EC (mS/cm) | Type and number of coordinating atoms | Substituent(s) (position) | SiN | TEOS | (—)**** |
| Slurry A | 0.25 | 2 N | $NH_2$ (C) | 251 | 8 | 32 (OK) |
| Slurry B | 2.5 | 2 N | Two $CH_3$ (C) | 59 | 7 | 8 (NG) |
| Slurry C | 2.8 | 1 N | Two $NH_2$ (C) | 121 | 8 | 15 (NG) |
| Slurry D | 0.08 | 2 N | $NH_2$ (N) | 94 | 4 | 24 (OK) |
| Slurry E | 0.12 | 2 N | SH (C) | 236 | 4 | 59 (Good) |
| Slurry F | 0.83 | 2 N | Two $NH_2$ (C) | 238 | 10 | 24 (OK) |

TABLE 4-continued

SiN and TEOS Removal Rates.

| Slurry*** | PoU EC (mS/cm) | SiN enhancer properties of heterocyclic N compounds | | Removal rates (A/min) | | SiN:TEOS selectivity (—)**** |
| --- | --- | --- | --- | --- | --- | --- |
| | | Type and number of coordinating atoms | Substituent(s) (position) | SiN | TEOS | |
| Slurry G | 0.11 | 2 N | $NH_2$ (C) | 184 | 4 | 46 (Good) |
| Slurry H* | 0.07 | 2 N | SH (C) | 205 | 5 | 41 (Good) |
| Slurry I | 0.07 | 2 N | SH (C) | 208 | 4 | 55 (Good) |
| Slurry J | 0.27 | 2N | SH (C) | 175 | 10 | 18 (NG) |

*Also contains 0.02 wt % pullulan in addition to the other listed ingredients.
***All slurries were adjusted to pH 5.
****Polishing conditions: 1.5 psi; 69 rpm; 125 ml/min; IC1010-A165-Westech (200 mm).
NG = Not good.

Slurry A (3-amino-1,2,4-triazole) was used as a comparative control in the two experiments in the study. SiN:TEOS selectivity should be compared against Slurry A for each experiment, as variations in pad state or wafer lots may affect removal rates. SiN:TEOS selectivity ≥Slurry A are considered good. Further, compositions with PoU EC≤0.12 mS/cm enable TEOS removal rates ≤5 Å/min.

Example 4—Comparison of Sulfonic Acid Modified Silica with Alumina-Coated Silica This experiment evaluated Particle A (sulfonic acid modified silica) and Particle B (alumina-coated silica) for electrical conductivity (EC) at pH 5. Slurry J (which is comparable to Slurry I with Particle B instead of Particle A) was formulated to check electrical conductivity. One consequence of using Particle B instead of Particle A was that a 3-fold higher amount of ammonium hydroxide amount was needed to reach the target pH=5.

The immobilization of an organic acid on colloidal silica cannot be achieved by only allowing colloidal silica and an organic acid to merely coexist. Instead, the organic acid must be immobilized on colloidal silica using a chemical reaction. Types of organic acids that may be immobilized on colloidal silica include sulfonic acids and carboxylic acids. Methods for performing the organic acid immobilization are known in the art. As one example, immobilization of a sulfonic acid on colloidal silica can be carried out by a method described in Cano-Serrano et al., "Sulfonic acid-functionalized silica through quantitative oxidation of thiol groups," *Chem. Commun.*, 2003, 2:246-247. In one method, colloidal silica in which a sulfonic acid is immobilized on its surface can be obtained by coupling a silane coupling agent having a thiol group (such as 3-mercaptopropyl trimethoxysilane) to colloidal silica, followed by oxidizing the thiol group with hydrogen peroxide. As another example, immobilization of a carboxylic acid on colloidal silica can be carried out by a method described in Kazuo et al., "Novel Silane Coupling Agents Containing a Photolabile 2-Nitrobenzyl Ester for Introduction of a Carboxy Group on the Surface of Silica Gel," *Chemistry Letters*, 2000, 29(3):228-229. In one method, colloidal silica in which a carboxylic acid is immobilized on its surface can be obtained by coupling a silane coupling agent including photoreactive 2-nitrobenzyl ester to colloidal silica, followed by photoirradiation.

Slurry J has almost a 4-fold higher EC than Slurry I. Based on TEOS removal rates for other slurries with comparable EC values in Table 3, Slurry J has a correspondingly and significantly higher TEOS removal rate versus Slurry I. This is believed to result from the use of the lower pH/higher EC particle and the 3-fold increase in ammonium hydroxide amount.

Thus, the lower pH/higher EC Particle B does not enable a slurry with the same low EC as a corresponding slurry with the higher pH/lower EC Particle A. Furthermore, in some embodiments, Particle A (sulfonic acid modified silica) is preferred over Particle B (alumina-coated silica) for applications requiring a high SiN removal rate with a simultaneous low removal rate for TEOS, or other low removal rate films with a removal rate positively dependent on EC.

It will be apparent to those skilled in the art that various modifications and variations can be made in the present invention without departing from the scope or spirit of the invention. Other aspects of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A polishing composition comprising an abrasive, a SiN removal rate enhancer, a pH adjusting agent, and water, wherein
    the abrasive is anion-modified silica wherein a surface of the anion-modified silica has sulfonic acid groups covalently attached;
    the SiN removal rate enhancer is a substituted 5- or 6-membered heterocycle, wherein the heterocyclic ring comprises at least two nitrogen atoms and the heterocycle is substituted with at least one group selected from —$NH_2$ and —SH; and
    the polishing composition has a pH from about 4 to about 6.

2. The polishing composition of claim 1, wherein the electrical conductivity from greater than zero to about 0.25 mS/cm.

3. The polishing composition of claim 1, wherein the SiN removal rate enhancer is monosubstituted with a —$NH_2$ or —SH.

4. The polishing composition of claim 3, wherein the SiN removal rate enhancer is a triazole.

5. The polishing composition of claim 3, wherein the SiN removal rate enhancer is a pyrazine.

6. The polishing composition of claim 3, wherein the SiN removal rate enhancer is selected from the group consisting of 3-mercapto-1,2,4-triazole, 3-amino-1,2,4-triazole, aminopyrazine, and combinations thereof.

7. The polishing composition of claim 6, wherein the SiN removal rate enhancer is 3-mercapto-1,2,4-triazole.

8. The polishing composition of claim 1, wherein the abrasive has a negative zeta potential in a range from about −30 mV to about −50 mV.

9. The polishing composition of claim 1, further comprising a sulfonic acid present in a concentration from about 0.0001 wt % to about 0.005 wt %.

10. The polishing composition of claim 9, wherein the sulfonic acid is naphthalene sulfonic acid, sodium salt.

11. The polishing composition of claim 1, wherein the polishing composition has a SiN:TEOS removal rate selectivity ratio of at least 40.

12. A method for polishing a substrate, the method comprising the steps of:
 a) providing the polishing composition of claim 1;
 b) providing a substrate, wherein the substrate comprises a silicon nitride layer; and
 c) polishing the substrate with the polishing composition to provide a polished substrate.

13. The method of claim 12, wherein the substrate is a semiconductor.

14. The method of claim 12, wherein the substrate further comprises a silicon oxide layer.

15. The method of claim 14, wherein the method results in a SiN:TEOS removal rate selectivity ratio of greater than about 40.

* * * * *